United States Patent
Guth et al.

(10) Patent No.: US 9,768,035 B2
(45) Date of Patent: Sep. 19, 2017

(54) ELECTRONIC MODULE AND METHOD FOR PRODUCING AN ELECTRONIC MODULE

(71) Applicant: Infineon Technologies AG, Neubiberg (DE)

(72) Inventors: Karsten Guth, Soest (DE); Guido Strotmann, Anroechte (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/880,532

(22) Filed: Oct. 12, 2015

(65) Prior Publication Data
US 2016/0104631 A1 Apr. 14, 2016

(30) Foreign Application Priority Data
Oct. 13, 2014 (DE) .................. 10 2014 114 808

(51) Int. Cl.
*H05K 7/00* (2006.01)
*H01L 21/48* (2006.01)
(Continued)

(52) U.S. Cl.
CPC ...... *H01L 21/4817* (2013.01); *H01L 21/4889* (2013.01); *H01L 23/053* (2013.01); *H01L 23/49811* (2013.01); *H01L 23/3735* (2013.01); *H01L 24/06* (2013.01); *H01L 24/29* (2013.01); *H01L 24/32* (2013.01); *H01L 24/37* (2013.01); *H01L 24/40* (2013.01); *H01L 24/45* (2013.01); *H01L 24/48* (2013.01); *H01L 24/83* (2013.01); *H01L 2224/06181* (2013.01); *H01L 2224/291* (2013.01); *H01L 2224/2919* (2013.01); *H01L 2224/32227* (2013.01); *H01L 2224/37147* (2013.01); *H01L 2224/40091* (2013.01); *H01L 2224/40101* (2013.01); *H01L 2224/40105* (2013.01); *H01L 2224/40157* (2013.01); *H01L 2224/40227* (2013.01); *H01L 2224/45014* (2013.01); *H01L 2224/45015* (2013.01); *H01L 2224/45147* (2013.01); *H01L 2224/48091* (2013.01); *H01L 2224/48101* (2013.01); *H01L 2224/48105* (2013.01);
(Continued)

(58) Field of Classification Search
CPC ............ H01L 21/4817; H01L 21/4889; H01L 23/053; H01L 23/48
USPC .................................. 361/728, 803
See application file for complete search history.

(56) References Cited

U.S. PATENT DOCUMENTS

4,628,150 A * 12/1986 Luc .................... H01R 43/0256
174/88 C
5,286,576 A * 2/1994 Srail ...................... B32B 27/18
428/297.4
(Continued)

*Primary Examiner* — Hung S Bui
(74) *Attorney, Agent, or Firm* — Murphy, Bilak & Homiller, PLLC (57) ABSTRACT

One aspect of the invention relates to an electronic module comprising a module housing and an electrically conductive connection element. The connection element has a first portion and a second portion, and also a shaft between the first portion and the second portion. The connection element, which is provided with a non-metallic coating in the region of the shaft, is injected together with the coating in the region of the shaft into the module housing, such that the connection element is fixed in the module housing.

17 Claims, 7 Drawing Sheets

(51) Int. Cl.
*H01L 23/053* (2006.01)
*H01L 23/498* (2006.01)
*H01L 23/373* (2006.01)
*H01L 23/00* (2006.01)

(52) U.S. Cl.
CPC ........... *H01L 2224/48157* (2013.01); *H01L 2224/48227* (2013.01); *H01L 2224/48472* (2013.01); *H01L 2224/73263* (2013.01); *H01L 2224/73265* (2013.01); *H01L 2224/8384* (2013.01); *H01L 2224/83424* (2013.01); *H01L 2224/83447* (2013.01); *H01L 2224/8546* (2013.01); *H01L 2224/85205* (2013.01); *H01L 2224/85424* (2013.01); *H01L 2224/85439* (2013.01); *H01L 2224/85444* (2013.01); *H01L 2224/85447* (2013.01); *H01L 2224/92246* (2013.01); *H01L 2224/92247* (2013.01); *H01L 2924/181* (2013.01); *H01L 2924/19107* (2013.01)

(56) References Cited

U.S. PATENT DOCUMENTS

| | | | | |
|---|---|---|---|---|
| 5,730,543 | A * | 3/1998 | Schonauer | C04B 37/023 403/179 |
| 6,914,321 | B2 * | 7/2005 | Shinohara | H01L 23/4334 257/502 |
| 7,709,947 | B2 * | 5/2010 | Ishikawa | H01L 24/49 257/666 |
| 2009/0213027 | A1 * | 8/2009 | Finn | G06K 19/07327 343/866 |
| 2012/0218714 | A1 * | 8/2012 | Robert | H01L 23/053 361/713 |
| 2012/0248094 | A1 * | 10/2012 | Strotmann | B23K 1/0016 219/616 |
| 2015/0332982 | A1 * | 11/2015 | Ono | H01L 24/40 257/676 |

\* cited by examiner

ELECTRONIC MODULE AND METHOD FOR PRODUCING AN ELECTRONIC MODULE

PRIORITY CLAIM

This application claims priority to German Patent Application No. 10 2014 114 808.8 filed on 13 Oct. 2014, the content of said application incorporated herein by reference in its entirety.

FIELD OF THE INVENTION

The embodiments described herein relate to an electronic module and to a method for producing an electronic module.

BACKGROUND

Connection contacts of electronic modules are often injected into a housing of the module. This may lead to the formation of gaps as a result of shrinkage of the plastic of the housing and as a result of a different thermal expansion behavior of the connection contact and the housing, and therefore the connection contact no longer sits fixedly in the housing.

If, during the production of the electronic module, the connection contact injected into the housing is to be connected by ultrasonic welding to another conductor element of the electronic module to be produced, a relative movement is required between the connection contact and the conductor element during the welding operation. For this purpose, one of the connecting partners, i.e., the connection contact and the conductor element, is made to oscillate, while the other connecting partner remains still. The relative movement, in combination with a contact pressure which presses the connecting partners against one another, forms a welded connection which fixedly connects the connecting partners to one another.

In order to obtain reproducible process results, it is generally desirable for the connection contacts to be fixed in the module housing in a manner which is as free from play as possible. The strength of the fixation in this respect has to be all the higher, and higher ultrasonic power is required during the ultrasonic welding process.

SUMMARY

It is an object of the present invention to provide an electronic module and a method for producing an electronic module having a housing, in which an electrical connection contact of the electronic module has the least mobility with respect to the housing.

These objects are achieved by an electronic module as claimed in patent claim 1 and respectively by a method for producing an electronic module as claimed in patent claim 11. Refinements and developments of the invention are the subject matter of dependent claims.

A first embodiment relates to an electronic module comprising a module housing and an electrically conductive connection element. The connection element has a first portion and a second portion, and also a shaft between the first portion and the second portion. The shaft is provided with a non-metallic coating. The connection element is injected together with the coating in the region of the shaft into the module housing, such that the connection element is fixed in the module housing.

A second embodiment relates to a method by which an electronic module which can be formed inter alia as per the

2 first aspect is produced. In the method, provision is made of an electrically conductive connection element, which has a first portion and a second portion, a shaft between the first portion and the second portion, and also a non-metallic coating at least in the region of the shaft. Furthermore, a module housing is produced. In this respect, the connection element provided with the coating is encapsulated by injection molding with a material which forms the module housing. A conductor element is arranged in the inner space of the module housing, and an electrically conductive connection is produced between the conductor element and the connection element in the region of the first portion.

BRIEF DESCRIPTION OF THE DRAWINGS

These and also further aspects of the invention will be explained hereinbelow on the basis of exemplary embodiments and with reference to the appended figures, in which.

The illustration in the figures is not true to scale. Unless indicated otherwise, the same reference signs in the figures denote identical elements or elements having an identical action.

DETAILED DESCRIPTION

Figure 1:
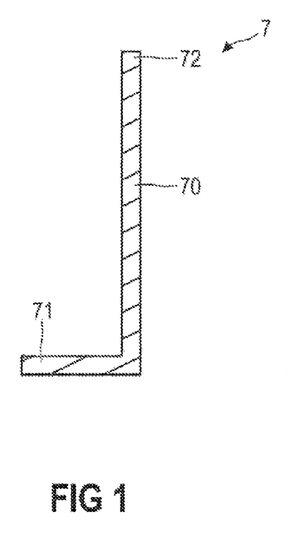
FIG. 1 shows a cross section through a connection element, according to an embodiment.

FIG. 1 shows a cross section through an electrically conductive connection element 7. The connection element 7 has a first portion 71, a second portion 72 and also a shaft 70, which connects the first portion 71 and the second portion 72 to one another in an electrically conductive manner and, in this sense, is arranged between the first portion 71 and the second portion 72. As shown, the first portion 71 and/or the second portion 72 may in each case optionally be an end of the connection element 7.

In principle, a connection element 7 can consist of any desired electrically conductive material, for example any desired metal or any desired metal alloy. By way of example, a connection element 7 can consist entirely or to an extent of at least 90 atom % of one of the following metals: copper; aluminum; gold; silver; iron, ferrous materials, or it can consist entirely or to an extent of at least 90 atom % of an alloy comprising at least two of said metals.

To produce a connection element 7, it is possible, for example, for a planar metal sheet to be punched and then optionally bent. Any other desired production methods can similarly be used, however.

Figure 2:
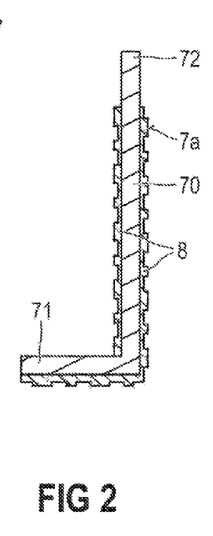
FIG. 2 shows the connection element as shown in FIG. 1 after a coating has been applied, according to an embodiment.

A coating 8 is then applied to the prefabricated connection element 7 or a primary product of the connection element 7, the result of this being shown in FIG. 2. The coating 8 may be in particular a non-metallic coating. By way of example, the coating 8 can comprise one of the following materials or consist of one of the following materials, in particular plastic: a thermoplastic material, a thermosetting plastic; an elastomer, a polymer alloy, a foamed material, a lacquer. Suitable coating methods are, for example, methods of plastic coating (for example powder coating), painting, printing, dipping or adhesive bonding of the coating to the connection element 7.

The coating 8 is applied at least in the region of the shaft 70. Since the portions 71 and 72 later serve for producing electrically conductive connections, the coating 8 has to have a cutout in each of these regions, such that the connection element 7 is exposed there.

A coating 8 can consist of only precisely one layer, as has been explained above, or else of two or more partial layers applied to the connection element 7 one on top of another. The individual partial layers in this respect can in each case consist of any one (different or identical) of the materials mentioned and/or can be applied to the connection element 7 in each case by any one (different or identical) of the methods mentioned.

During an injection molding process, by which a module housing 6 is produced, the connection element 7 provided with the coating 8 is then encapsulated by injection molding with the material for producing the module housing 6. As a result, the connection element 7 provided with the coating 8 is injected fixedly into the module housing 6, this being shown in FIG. 3.

Figure 3:
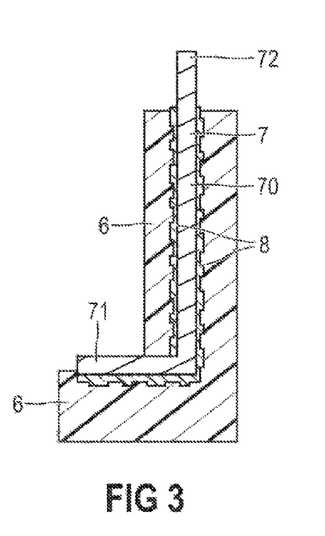
FIG. 3 shows a cross section through a portion of a module housing, into which the connection element provided with the coating as shown in FIG. 2 is injected, according to an embodiment.

As has been determined with the present invention, an arrangement of this type does not tend to experience gap formation, or tends to experience gap formation to a considerably lesser extent than would be the case if the uncoated connection element 7—as in the case of corresponding conventional arrangements—were to be injected into the module housing 6 without a coating 8. As a consequence thereof, the connection element 7 has a considerably smaller relative mobility with respect to the module housing 6 than would be the case given a corresponding conventional arrangement. The coating 8 performs the function of an adhesion promoter between the connection element 7 and the module housing 6, and it compensates for gaps which would otherwise arise during shrinkage processes.

In order to increase the adhesion between the coating 8 and the module housing 6 to be produced, the coating 8 can be formed in such a way that, before the injection molding operation by which the module housing 6 is produced, the outer side 7a thereof which is remote from the connection element 7 has a high surface roughness, this being shown schematically in FIG. 2.

The finished module housing 6 may be dielectric. It can optionally comprise a glass fiber proportion, for example of at least 10% by volume or of at least 20% by volume, and/or a flame retardant, for example a halogen-based flame retardant, a nitrogen-based flame retardant, an organophosphorus-based flame retardant, an inorganic flame retardant.

Furthermore, the coating 8 can consist of a material which differs from the material of the module housing 6.

In principle, the number of connection elements 7 injected into a module housing 6 and provided with a coating 8 can be selected as desired.

Figure 4:
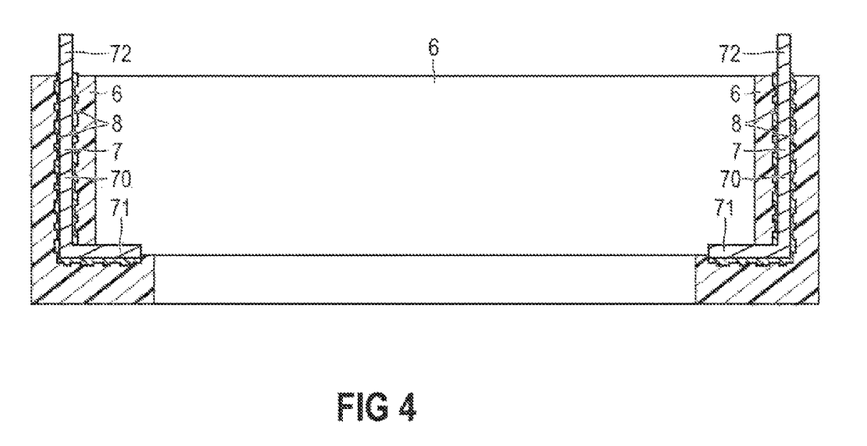
FIG. 4 shows a cross section through a module housing, into which a plurality of connection elements each provided with a coating as shown in FIG. 3 are injected, according to an embodiment.

FIG. 4 shows a cross section through a housing 6 for an electronic module, into which a plurality of connection elements 7 each provided with a coating 8 have been injected. The first portions 71 are in this case each arranged in the interior of the housing 6, whereas the second portions 72 each protrude out of the module housing 6.

Figure 5:
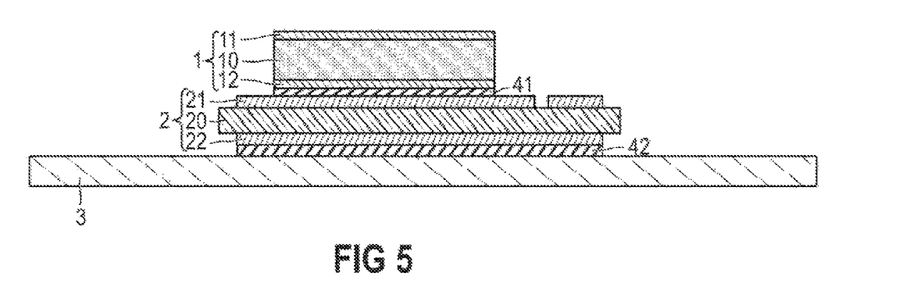
FIG. 5 shows a cross section through an electronic subassembly having a circuit carrier, according to an embodiment.

FIG. 5 shows a cross section through an electronic subassembly. The latter has a circuit carrier 2. A semiconductor chip 1 is arranged on the circuit carrier 2.

The optional semiconductor chip 1 can contain any desired electronic component, for example a MOSFET (Metal Oxide Semiconductor Field Effect Transistor), an IGBT (Insulated Gate Bipolar Transistor), a thyristor, a JFET (Junction Field Effect Transistor), an HEMT (High Electron Mobility Transistor), a diode, etc., and alternatively or additionally also one or more other, arbitrary, active or passive electronic components. The semiconductor chip 1 has a semiconductor body 10 and also, in each case optionally, an upper chip metallization 11 and a lower chip metallization 12.

The circuit carrier 2, which is likewise optional, has a dielectric insulation carrier 20, to which an upper metallization layer 21 is applied, and also an optional lower metallization layer 22. If an upper and a lower metallization layer 21, 22 are present, they are located on opposite sides of the insulation carrier 20. The upper metallization layer 21 can be structured, if required, such that it has conductor tracks which can be utilized, for example, for electrical interconnection and/or for chip mounting. The dielectric insulation carrier 20 can be used to electrically insulate the upper metallization layer 21 and the lower metallization layer 22 from one another.

The circuit carrier 2 may be a ceramic substrate, in which the insulation carrier 20 is in the form of a thin layer comprising ceramic or consisting of ceramic. Suitable materials for the upper metallization layer 21 and, where present, the lower metallization layer are metals with good electrical conductivity, such as for example copper or copper alloys, aluminum or aluminum alloys, but also any other desired metals or alloys. If the insulation carrier 20 comprises ceramic or consists of ceramic, the ceramic may be, for example, aluminum oxide ($Al_2O_3$) or aluminum nitride (AlN) or zirconium oxide ($ZrO_2$), or a mixed ceramic additionally comprising, in addition to at least one of said ceramic materials, at least one further ceramic material differing therefrom. By way of example, a circuit carrier 2 can be in the form of a DCB substrate (DCB=Direct Copper Bonding), in the form of a DAB substrate (DAB=Direct Aluminum Bonding), in the form of an AMB substrate (AMB=Active Metal Brazing) or in the form of an IMS substrate (IMS=Insulated Metal Substrate). The upper metallization layer 21 and, where present, the lower metallization layer 22 can each have, independently of one another, a thickness in the range of 0.05 mm to 2.5 mm. The thickness of the insulation carrier 20 can lie in the range of 0.1 mm to 2 mm, for example. Thicknesses which are larger or smaller than those specified are likewise possible, however.

In the case of the electronic subassembly shown, the semiconductor chip 1 is connected to the circuit carrier 2 in an integral and optionally also electrically conductive manner by means of a first connecting layer 41. To this end, the first connecting layer 41 adjoins both the semiconductor chip 1 (here on the lower chip metallization 12 thereof, for example) and the circuit carrier 2 (here on the upper metallization layer 21 thereof, for example). The first connecting layer 41 may be, for example, a sintered layer, a soldered layer or an adhesive layer, it being possible for the latter to be electrically insulating or electrically conductive, depending on the requirements of the circuit to be realized. The first connecting layer 41 can optionally be formed in such a way that it is solid at a temperature of 180° C. If the first connecting layer 41 is meltable, it can accordingly have a melting point of above 180° C.

Furthermore, the electronic subassembly can optionally have a base plate 3, to which the circuit carrier 2 populated with the semiconductor chip 1 is connected in an integral and optionally also electrically conductive manner by means of a second connecting layer 42. To this end, the second connecting layer 42 adjoins both the circuit carrier 2 (here on the lower metallization layer 22 thereof) and the base plate 3. The second connecting layer 42 may be, for example, a sintered layer, a soldered layer or an adhesive layer, it being possible for the latter to be electrically insulating or electrically conductive. To produce an arrangement of this type, the circuit carrier 2, as explained, can be prepopulated with a semiconductor chip 1 and then connected to the base plate 3. The base plate 3 may be, for example, a metal plate consisting of or comprising a material of good thermal conductivity, such as, for example, copper or aluminum. The base plate 3 can moreover have a thin surface coating (e.g. consisting of nickel) produced, for example, by electroplating, in order to prevent oxidation and improve solderability. The base plate 3 can similarly consist of a metal matrix composite (MMC) material.

To produce an electronic module 100, a prefabricated electronic subassembly, as has been explained with reference to FIG. 5, can be connected to a module housing 6, into which, as explained above, at least one connection element 7 provided with a coating 8 has been injected, the result of this being shown in FIG. 6. If the electronic subassembly has a semiconductor chip 1, the latter is arranged here in the inner space of the module housing 6.

In order to connect the electronic subassembly to the connection element or elements 7 in an electrically conductive manner, it is possible for bonding wires 5 to be used. To this end, the bonding wires 5 are welded in each case to a connection element 7 at a bonding site B2 and B3, respectively, in the region of the first portion 71 of the connection element 7 in question. The respective welded connection can be produced by ultrasonic welding (wire bonding). In this respect, the bonding wire 5 can be welded to the connection element 7 directly, i.e. without the use of an additional connection means such as, for example, a solder or an electrically conductive adhesive. The connection in question can thus be free from solder and/or adhesive.

As is furthermore shown by way of example, a bonding wire 5 of this type can be welded to the upper chip metallization 11 at a bonding site B1, or to the upper metallization layer 21 at a bonding site B4. In this respect, too, the bonding wire 5 can be welded to the upper chip metallization 11 or to the upper metallization layer 21 directly, i.e. without the use of an additional connection means such as, for example, a solder or an electrically conductive adhesive. The connection in question can thus be free from solder and/or adhesive.

In the example shown, the upper chip metallization 11 and the lower chip metallization 12 are connected in each case to a different one of the connection elements 7 in an electrically conductive manner. As a result, the upper chip metallization 11 and the lower chip metallization 12 can be electrically contact-connected, via the second portions 72, from the outer side of the electronic module 100. In principle, however, connection elements 7, which, as explained, are provided with a coating 8 and injected into a module housing 6, can be used to transmit any desired electrical potentials and/or signals between the interior of the module housing 6 and the exterior of the module housing 6.

It is optionally possible for a dielectric potting compound (not shown), for example a silicone gel or any other desired dielectric potting compound, to be introduced into the module housing 6, in order to increase the dielectric strength of the electronic module 100 and/or in order to protect components incorporated in the electronic module 100 against moisture or contamination. A potting compound of this type can then extend, proceeding from the base plate 3, as far as beyond the semiconductor chip 1 or even as far as beyond all of the bonding wires 5.

Figures 7, 8:
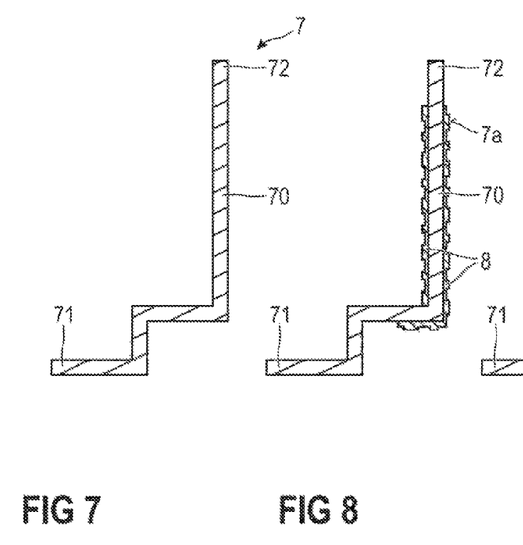
FIG. 7 shows a cross section through a connection element, according to an embodiment.
FIG. 8 shows the connection element as shown in FIG. 7 after a coating has been applied, according to an embodiment.
Figure 9:
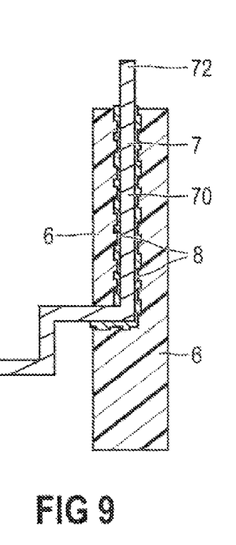
FIG. 9 shows a cross section through a portion of a module housing, into which the connection element provided with the coating as shown in FIG. 8 is injected, according to an embodiment.
Figure 10:
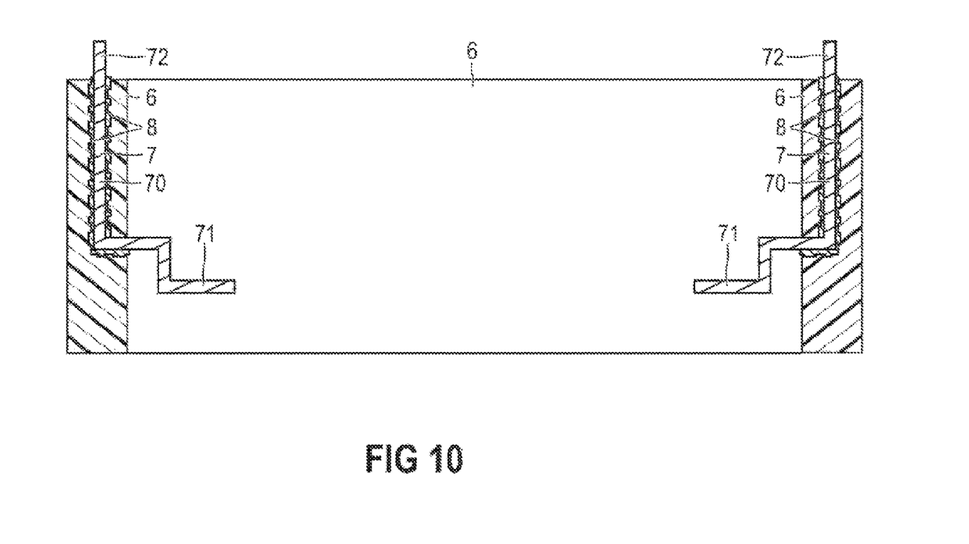
FIG. 10 shows a cross section through a module housing, into which a plurality of connection elements each provided with a coating as shown in FIG. 9 are injected, according to an embodiment.

FIGS. 7 to 9 show a further example of a connection element 7, which, as explained, is provided with a coating 8 (FIG. 8) and then injected into a module housing 6 (FIG. 9). For this purpose, it is possible to use the same methods and materials as have already been explained above. FIG. 10 shows a module housing 6, into which, by way of example, a plurality of such connection elements 7 each provided with a coating 8 are injected.

Figure 11:
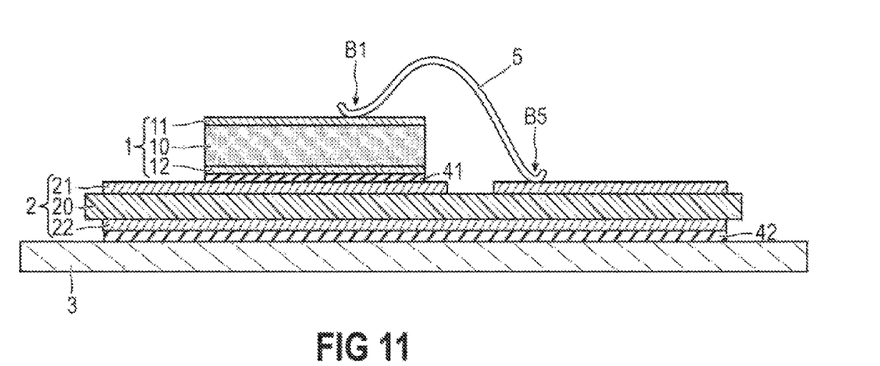
FIG. 11 shows a cross section through an electronic subassembly having a circuit carrier, according to an embodiment.

FIG. 11 shows a cross section through an electronic subassembly, the design of which corresponds to the design of the electronic subassembly already explained with reference to FIG. 5. In addition, provision is made of a bonding wire 5 which connects the upper chip metallization 11 in an electrically conductive manner to a conductor track formed by a portion of the upper metallization layer 21. To this end, the bonding wire 5 is bonded to the upper chip metallization 11 in an electrically conductive manner at a bonding site B1, and also to the upper metallization layer 21 at a further bonding site B5.

The semiconductor chip 1 is connected to a further portion of the upper metallization layer 21 in an integral and electrically conductive manner by means of a connecting layer 41 at the lower chip metallization 12, in the same way as the semiconductor chip 1 as shown in FIG. 5 is connected to the upper metallization layer 21.

To produce an electronic module 100, a prefabricated electronic subassembly, as has been explained with reference to FIG. 11, can be connected to a module housing 6, into which, as explained above, at least one connection element 7 provided with a coating 8 has been injected, the result of this being shown in FIG. 12. If the electronic subassembly has a semiconductor chip 1, the latter is arranged here in the inner space of the module housing 6.

In order to connect the electronic subassembly to the connection element or elements 7 in an electrically conductive manner, the first portions 71 of the latter are welded to the upper metallization layer 21 at a welding site S1 and S2, respectively, in the region of the first portion 71 of the connection element 7 in question. The respective welded connection can be produced by ultrasonic welding (wire bonding). In this respect, the connection element 7 in question can be welded to the upper metallization layer 21 directly, i.e., without the use of an additional connection means such as, for example, a solder or an electrically conductive adhesive. The connection in question can thus be free from solder and/or adhesive.

Figure 6:
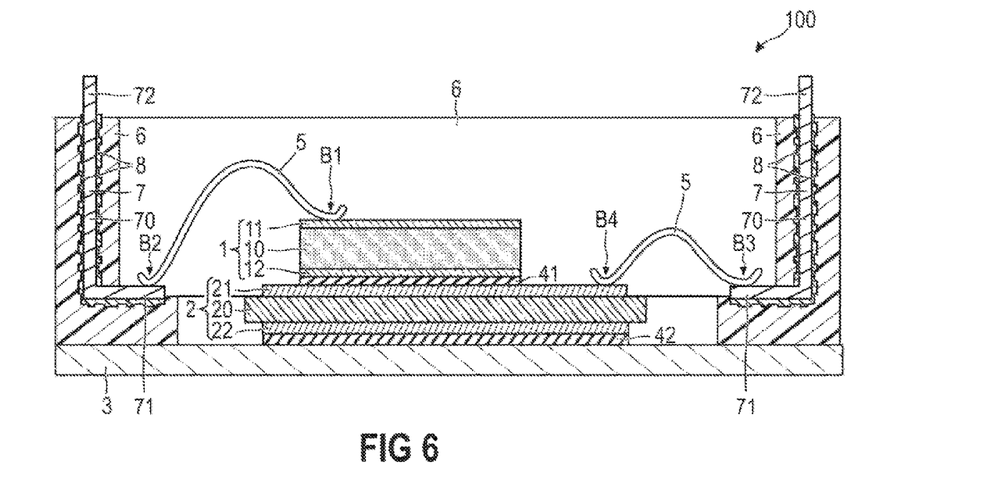
FIG. 6 shows a cross section through an electronic module which has a solid base plate, has the module housing as shown in FIG. 4 and also the circuit carrier as shown in FIG. 5, and in which a bonding wire is welded to the connection element, according to an embodiment.
Figure 12:
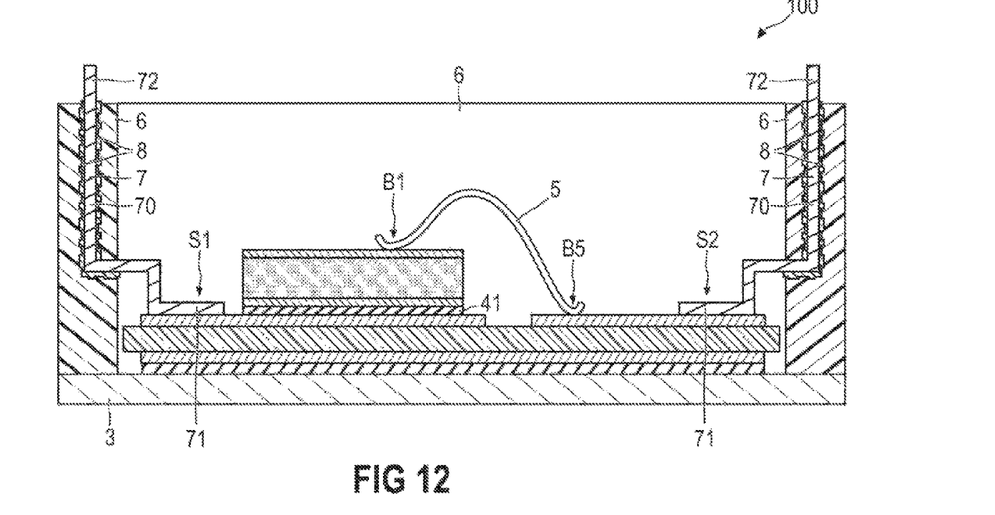
FIG. 12 shows a cross section through an electronic module which has a solid base plate, has the module housing as shown in FIG. 10 and also the circuit carrier as shown in FIG. 11, and in which a connection element is welded, in the region of the first portion thereof, to a conductor track of the circuit carrier, according to an embodiment.
Figure 13:
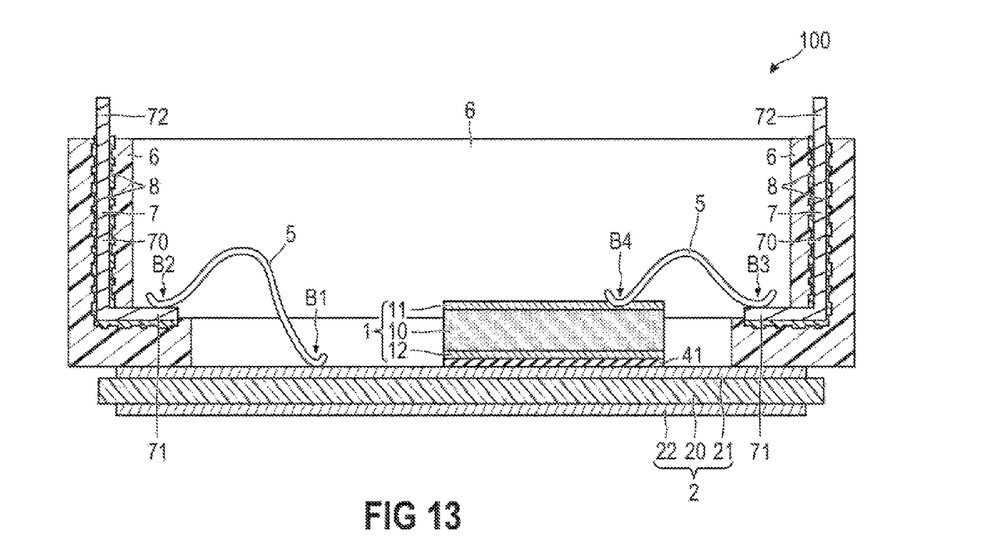
FIG. 13 shows a cross section through an electronic module having a circuit carrier, a bonding wire being welded to a connection element, according to an embodiment.
Figure 14:
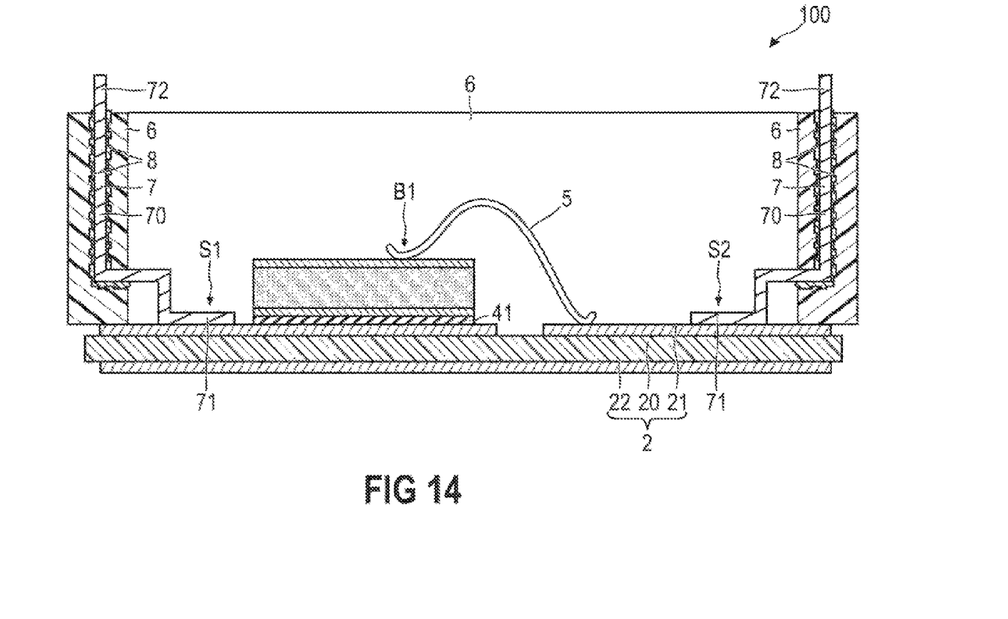
FIG. 14 shows a cross section through an electronic module which has a circuit carrier and in which a connection element is welded, in each case in the region of the first portion thereof, to a conductor track of the circuit carrier, according to an embodiment.

Whereas the circuit carriers 2 in each of the electronic subassemblies explained to date were arranged on a solid base plate 3, which, in the electronic module 100 as shown in FIGS. 6 and 12, forms the bottom side of the electronic module, the electronic modules 100 shown in FIGS. 13 and 14 do not have such a base plate 3. Here, the lower metallization layer 22 forms the bottom side of the electronic module 100 in each case. For the rest, the statements made in respect of the electronic module 100 as shown in FIG. 6 apply for the design of the electronic module 100 as shown in FIG. 13, and the statements made in respect of the electronic module 100 as shown in FIG. 12 apply for the design of the electronic module 100 as shown in FIG. 14. Whereas the circuit carrier 2 in the electronic modules 100 as shown in FIGS. 6 and 12 is inserted into the respective module housing 6, the module housing 6 in the electronic modules 100 as shown in FIGS. 13 and 14 is positioned onto the circuit carrier 2.

If, in the case of an electronic module 100 which does not have a solid base plate 3, a dielectric potting compound (not shown in FIGS. 13 and 14), for example a silicone gel or any other desired dielectric potting compound, is introduced, in order to increase the dielectric strength of the electronic module 100 and/or in order to protect components incorporated in the electronic module 100 against moisture or contamination, a potting compound of this type can extend, proceeding from the circuit carrier 2, as far as beyond the semiconductor chip 1 or even as far as beyond all of the bonding wires 5.

In the electronic modules 100 explained above, a bonding wire 5 can in principle consist of any desired wire material. In particular, a bonding wire 5 which, as shown in FIGS. 6 and 13, is welded directly to a connection element 7 in the region of a first portion 71 by ultrasonic welding can consist entirely or to an extent of at least 90 atom % of copper.

Furthermore, outside bonding sites, a bonding wire 5 can have a line cross section (i.e., transversely to the direction of current flow) of at least 7853 $\mu m^2$, or even at least 70 685 $\mu m^2$, this corresponding, in the case of a bonding wire 5 with a circular cross section, to a nominal diameter (i.e., outside bonding sites) of at least 100 $\mu m$ and, respectively, at least 300 $\mu m$. As an alternative or in addition, a bonding wire 5 of this type can also have a line cross section of at most 785 398 $\mu m^2$, this corresponding, in the case of a bonding wire 5 with a circular cross section, to a nominal diameter of at least 1000 $\mu m$.

However, a bonding wire 5 is considered to be not only bonding wires having a circular cross section outside bonding sites, but rather also what are termed bonding ribbons, which have any other desired cross section, for example an approximately rectangular cross section.

Correspondingly, a connection element 7 can have a line cross section (i.e., transversely to the direction of current flow) of at least 0.25 $mm^2$, or even at least 50 $mm^2$.

In principle, the coating 8 can be applied to a connection element 7 in various ways. By way of example, a prefabricated individual connection element 7, as has been explained by way of example on the basis of FIGS. 1 and 7, can be provided with the coating 8. It is similarly possible to apply the coating 8 to a primary product, from which a plurality of connection elements 7 are separated. Examples of such methods will be explained hereinbelow on the basis of FIGS. 15A to 15C and 16A to 16D.

Figure 15A:
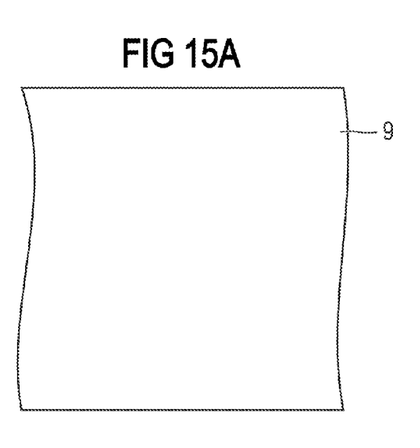
FIGS. 15A-15C show various steps of a method for producing a coated connection element, according to an embodiment.
Figure 15B:
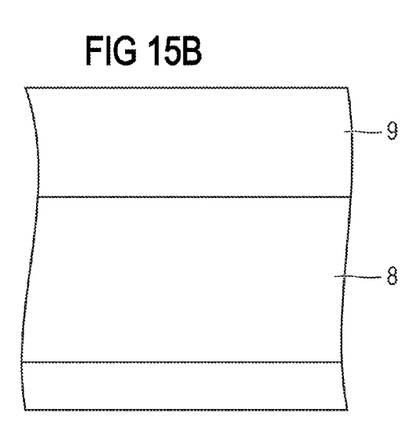
Figure 15C:
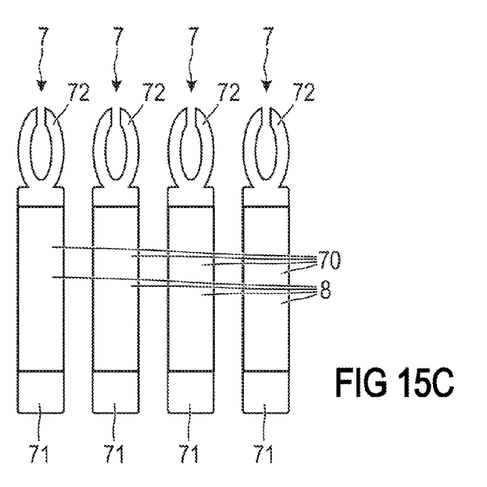

In the method explained on the basis of FIGS. 15A to 15C, firstly a raw tape 9 is provided as the primary product. This can consist, for example, of the material or the material combination of the connection elements 7 which are to be produced therefrom. FIG. 15A shows a portion of such a raw tape 9. A coating 8 is then applied to the raw tape 9, the result of this being shown in FIG. 9, and the coated raw tape 9 is then punched in one or more punching steps, such that, as a result, individual mutually independent connection elements 7 each already provided with a coating 8 are present, this being shown in FIG. 15C. Immediately after the punching, the connection elements 7 may still be planar, and then bent, for example to form an angled connection element 7 provided with a coating 8, as shown in FIGS. 2 and 7.

Figure 16A:
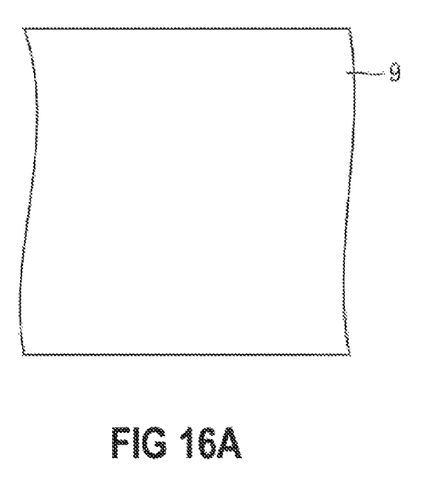
FIGS. 16A-16D show various steps of a further method for producing a coated connection element, according to an embodiment.
Figure 16B:
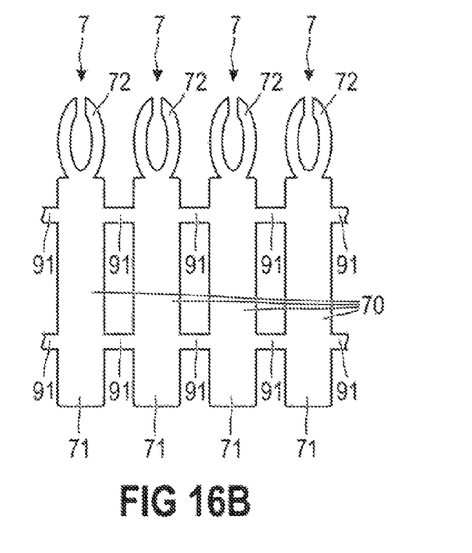
Figure 16C:
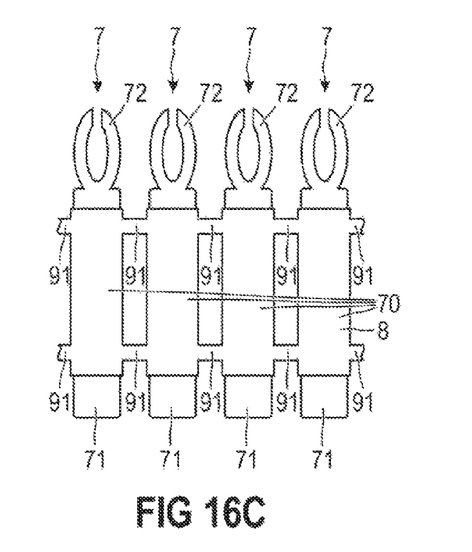
Figure 16D:
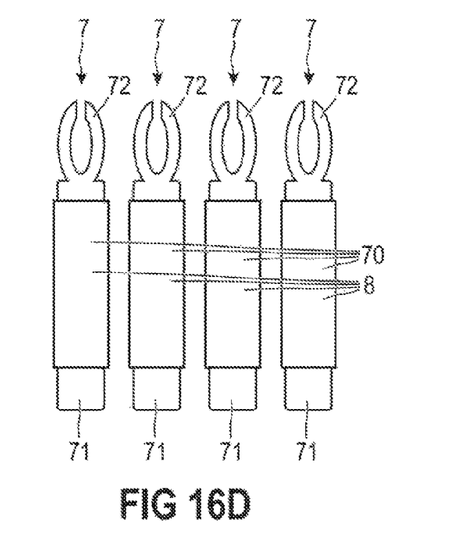

In the method explained on the basis of FIGS. 16A to 16D, firstly a raw tape 9 is again provided as the primary product, as has already been explained with reference to FIG. 15A (see FIG. 16A). The raw tape 9 is then punched in one or more punching steps in such a manner that, as a result, a plurality of connection elements 7 still connected to one another by webs 91 are present in a punched strip, as is shown by way of example in FIG. 16B. A coating 8 is then applied to the connection elements 7 still connected to one another by webs 91, the result of this being shown in FIG. 16C. In a further punching step, the connection elements 7 can be separated after the webs 91 have been cut off or severed, such that each of the separated connection elements 7 has a coating 8, the result of this being shown in FIG. 16D. Here, too, the coated connection elements 7 may still be planar immediately after the coating and separation, and may then be bent if required, for example to form an angled connection element 7 provided with a coating 8, as shown in FIGS. 2 and 7.

Irrespective of whether the coating 8 is applied to an already separated connection element 7 or to a primary product from which a plurality of coated connection elements 7 are produced, the coating 8 may already be applied to the connection element 7 or the primary product in such a way that the finished connection element 7 is exposed in the first portion 71 and/or in the second portion 72. It is similarly possible, however, to apply the coating 8 to the connection element 7 or the primary product in such a manner that the connection element 7, if appropriate after the separation, is also covered by the coating 8 in the first and/or second portion 71 or 72, and is then exposed in the region of the first and/or second portion 71 or 72 by partial removal of the coating 8.

If a connection element 7 is produced by punching, the coating 8 can be applied before or after the punching, or between two punching steps. If a connection element 7 is produced by bending, the coating 8 can be applied before or after the bending.

What is claimed is:

1. An electronic module, comprising:
    a module housing;
    an electrically conductive connection element, which has a first portion, a second portion and a shaft between the first portion and the second portion, the shaft being provided with a non-metallic coating; and the connection element being injected together with the coating in the region of the shaft into the module housing, such that the connection element is fixed in the module housing.

2. The electronic module as claimed in claim 1, comprising a circuit carrier, which has a conductor track and which is fastened on the module housing.

3. The electronic module as claimed in claim 2, in which the connection element is welded to the conductor track at a first connection site in the region of the first portion and is thereby connected to said conductor track in an electrically conductive manner.

4. The electronic module as claimed in claim 2, comprising a bonding wire, which is arranged in the module housing and which is bonded directly to the connection element at a second connection site in the region of the first portion.

5. The electronic module as claimed in claim 4, in which the bonding wire has a line cross section of at least 7853 $\mu m^2$.

6. The electronic module as claimed in claim 4, in which the bonding wire consists entirely or to an extent of at least 90 atom % of copper.

7. The electronic module as claimed in claim 1, in which the connection element comprises at least 90 atom % of one of the following metals: copper; aluminum; gold; silver; and iron; or comprises at least 90 atom % of an alloy, the allow comprising at least two of the following metals: copper; aluminum; gold; silver; and iron.

8. The electronic module as claimed in claim 1, in which the module housing is dielectric and comprises the following:
    a glass fiber proportion of at least 10% by volume or of at least 20% by volume; and/or
    a flame retardant.

9. The electronic module as claimed in claim 1, in which the coating consists of a material which differs from the material of the module housing.

10. The electronic module as claimed in claim 1, in which the coating comprises one of the following materials: a thermoplastic material; a thermosetting plastic; an elastomer; a polymer alloy; a foam material; and a lacquer.

11. A method by which an electronic module is formed as claimed in claim 1, the method comprising:
    providing an electrically conductive connection element, which has a first portion, a second portion, a shaft between the first portion and the second portion, and also a non-metallic coating at least in the region of the shaft;
    producing a module housing, the connection element provided with the coating being encapsulated by injection molding with a material which forms the module housing;
    arranging a conductor element in an inner space of the module housing; and
    producing an electrically conductive connection between the conductor element and the connection element in the region of the first portion.

12. The method as claimed in claim 11, in which the electrically conductive connection is produced by connecting the conductor element and the connection element directly to one another by ultrasonic welding in the region of the first portion.

13. The method as claimed in claim 11, in which the conductor element is in the form of a conductor track of a circuit carrier or is in the form of a bonding wire.

14. The method as claimed in claim 11, in which the coating is applied by one of the following methods: plastic coating; powder coating; painting; printing; dipping; adhesive bonding.

15. The method as claimed in claim 11, in which the coating comprises one of the following materials or consists of one of the following materials: plastic; a thermoplastic material; a thermosetting plastic; an elastomer; a polymer alloy; a foamed material; and a lacquer.

16. The method as claimed in claim 1, in which providing the connection element comprises the following steps:
    applying the coating to an individual planar or bent connection element; or
    applying the coating to a primary product and subsequently separating the coated primary product to form a plurality of individual connection elements which are each coated and of which one forms the provided connection element.

17. The electronic module as claimed in claim 1, wherein the non-metallic coating is provided such that an outer side of at least a portion of the shaft has a roughened surface before being injected.

* * * * *